United States Patent [19]

Chao et al.

[11] Patent Number: 4,536,942
[45] Date of Patent: Aug. 27, 1985

[54] FABRICATION OF T-SHAPED METAL LINES FOR SEMICONDUCTOR DEVICES

[75] Inventors: Pane-Chane Chao; Walter H. Ku, both of Ithaca, N.Y.

[73] Assignee: Cornell Research Foundation, Inc., Ithaca, N.Y.

[21] Appl. No.: 658,066

[22] Filed: Oct. 5, 1984

Related U.S. Application Data

[62] Division of Ser. No. 448,158, Dec. 9, 1982, abandoned.

[51] Int. Cl.³ .......................................... H01L 21/285
[52] U.S. Cl. ....................................... 29/571; 29/579; 29/591; 357/15; 148/DIG. 143
[58] Field of Search .......................... 29/571, 579, 591; 357/15, 22, 68; 148/DIG. 143

[56] References Cited

U.S. PATENT DOCUMENTS

| 4,213,840 | 7/1980 | Omori et al. | 357/15 |
| 4,334,349 | 6/1982 | Aoyama et al. | 29/579 |
| 4,377,899 | 3/1983 | Otani et al. | 29/579 X |

OTHER PUBLICATIONS

G. O. Ladd Jr et al, "E-Beam Technology for K-Band GaAs FET's", US Army Report EDLET-TR-77-29-69-2, Hughes Aircraft Co., Feb. 1980, (pp. 53–57).
Y. Todokoro, "Double-Layer Resist Films for Submicrometer Electron-Beam Lithography", IEEE Trans. Electron Devices, vol. ED-27, pp. 1443–1448, Aug. 1980.
M. Matsumura et al, "Sub-Micrometre Lift-Off Line with T-Shaped Cross-Sectional Form", Electron. Lett, vol. 17, pp. 450–451, Jun. 1981.
K. Kamei et al, "Extremely Low-Noise MESFET's Fabricated by Metal-Organic Chemical Vapour Deposition", Electron. Lett., vol. 17, pp. 450–451, Jun. 1981.
G. C. Taylor et al., "Ion-Implanted K-Band GaAs Power FET", in MTT-S Int. Microwave Symp. Dig., pp. 446–448, 1981.
H. Morkoc et al., "Tungsten/Gold Gate GaAs Microwve FET", Electron. Lett., vol. 14, pp. 514–515, Aug. 1978.
S. Takahashi et al, Sub-Micrometer Gate Fabrication of GaAs MESFET by Plasma Etching", IEEE Trans. Electron Devices, vol. ED-25, pp. 1213–1218, Oct. 1978.

*Primary Examiner*—Brian E. Hearn
*Assistant Examiner*—Alan E. Schiavelli
*Attorney, Agent, or Firm*—Jones, Tullar & Cooper

[57] ABSTRACT

A method of fabricating MESFET devices having a T-shaped gate electrode is disclosed. The method includes the formation of a single layer of resist material on a semiconductor surface; formation of a resist cavity through optical lithography, the cavity exposing a selected portion of the semiconductor surface; depositing by way of dual-angle evaporation gate walls within said resist cavity, the gate walls defining a T-shaped gate cavity; depositing gate electrode material within the gate cavity, removing the resist material, and removing the gate walls from the gate electrode material.

19 Claims, 5 Drawing Figures

FABRICATION OF T-SHAPED METAL LINES FOR SEMICONDUCTOR DEVICES

BACKGROUND OF THE INVENTION

The invention described herein was made in part in the course of work under a grant award No. N00014-79-C-0767 of the Office of Naval Research.

This application is a division, of application Ser. No. 448,158, filed Dec. 9, 1982 now abandoned.

The present invention relates, in general, to high frequency semiconductor devices, and more particularly to an improved method of fabricating low-resistance submicron gates for metal-semiconductor field effect transistors (MESFET's).

The fabrication of a MESFET device involves the formation of drain, source and gate electrodes on the surface of a semiconductor substrate. Ohmic contacts are generally used for the drain and source electrodes, whereas a rectifying Schottky barrier metal system is used for the gate electrode. Such devices are useful in high frequency applications, particularly in the microwave range, but care must be exercised to insure that the time constant determined by the gate capacitance and resistance is sufficiently small to permit operation in the microwave range.

The parasitic gate capacitance can be minimized by shortening the gate length, but such shortening is, at best, a mixed blessing, for it can lead to a decreased cross-sectional area and a resultant increase in gate resistance. This, in turn, reduces the efficiency of the device and reduces gain.

A solution to the foregoing problem has been shown to be the provision of a T-shaped (or mushroomshaped) gate structure in which extremely low gate resistance and a very short gate length near the Schottky interface can be simultaneously obtained. Such T-shaped structures have been developed, in the prior art, by using a double-layer photoresist or electron beam resist technique. Such techniques involve complicated optical or electron beam lithography processes, however, which present alignment and other problems. Examples of such double-layer techniques to produce T-shaped gate structures include the following:

G. O. Ladd, Jr. et al., "E-beam technology for K-band GaAs FET's," U.S. Army Report DELET-TR-77-2696-2, Hughes Aircraft Co., February 1980 (pages 53–57).

M. Omori et al., "Low resistance, fine line semiconductor device and the method for its manufacture," U.S. Pat. No. 4,213,840, issued July 22, 1980.

Y. Todokoro, "Double-layer resist films for submicrometer electron-beam lithography," IEEE Trans. Electron Devices, vol. ED-27, pp. 1443–1448, August 1980.

M. Matsumura et al., "Sub-micrometre lift-off line with T-shaped cross-sectional form," Electron. Lett., vol. 17, pp. 429–430, June 1981.

K. Kamei et al., "Extremely low-noise MESFET's fabricated by metal-organic chemical vapour deposition," Electron. Lett., vol. 17, pp. 450–451, June 1981.

G. C. Taylor et al., "Ion-implanted K-band GaAs power FET," in MTT-S Int. Microwave Symp. Dig., pp. 46–48, 1981.

T-shaped gate structures have also been fabricated by utilizing a selective dry etching of a double-layered metal, as described in the following:

H. Morkoc et al., "Tungsten/gold gate GaAs microwave FET", Electron. Lett., vol. 14, pp. 514–515, August 1978.

S. Takahashi et al., "Sub-micrometer gate fabrication of GaAs MESFET by plasma etching", IEEE Trans. Electron Devices, vol. ED-25, pp. 1213–1218, October 1978.

This technique, however, requires a calibrated undercut etching process for reliable reproducibility. Further, the dry etching process may result in damage to the device channel region. In addition, unless a selfaligned process using an $n^+$ implantation is adopted, the source resistance will be high in the resulting device, since a recessed-gate structure cannot be made using this technique.

SUMMARY OF THE INVENTION

It is an object of the present invention to provide an improved method of fabricating T-shaped gate structures for MESFET devices which avoids the problems of prior art techniques.

It is another object of the invention to provide a new technique for generating sub-quarter-micron T-shaped gate structures for MESFET devices.

It is still another object of the present invention to provide a simplified method for fabricating low resistance T-shaped gate structures utilizing a single-level resist and a two-step evaporation process.

Another object of the present invention is the fabrication of a T-shaped metal line gate structure through the use of an angle-evaporation technique on a metallized resist profile.

The objects of the present invention are achieved, and the disadvantages of prior fabrication techniques are avoided, through a fabrication process for MESFET devices capable of operating at microwave frequencies comprising the steps of depositing a layer of resist material on a semiconductor surface, lithographically defining a gate pattern on the resist material and removing the pattern area to produce a resist cavity. This resist cavity may be elongated, has a cross-sectional profile which is slightly undercut near the upper surface of the resist, and exposes a predetermined portion of the semiconductor surface. Metal gate walls are formed on the elongated inner surfaces of the resist cavity by dual-angle evaporation which produces a metalized T-shaped (in cross-section) gate cavity having a length at the surface of the semiconductor on the order of 0.2 $\mu$m, the length being determined by the thickness of the resist layer, the length of the opening at the top of the resist layer, and the evaporation angles.

After forming the metal gate walls, the gate material is evaporated into the gate cavity, the evaporation being in a direction normal to the semiconductor material surface to form a T-shaped metal line within the gate cavity and in contact with the semiconductor surface. The evaporation of the gate material is followed by the removal of excess gate material from the surface of the resist layer and removal of the resist layer itself, leaving the T-shaped metal line supported by the gate walls. These walls are then removed, as by etching, to leave a free-standing metal line which, in the illustrated embodiment of the invention, serves as a gate electrode for a MESFET device.

The gate electrode produced in accordance with the foregoing method has, in its cross-sectional dimension, a length at the semiconductor surface (i.e., at the Schottky interface) which may be about 0.2 μm. The electrode may have a height of about 1.6 μm and at the top of the T-shape, a length of about 0.8 μm. In an experimental fabrication of the gate, the electrode was formed as a metal line having a T-shaped cross section, the line having a width of 150 μm. The resulting device showed a measured gate resistance of 6.1 Ω/mm of gate width, which is lower than the resistance value reported for prior devices of this type.

The process described above is extremely simple, particularly since only a single-level resist coating is required, and no calibrated dry-etching is needed. The length of the T-shaped line is easily established by the thickness of the resist and the length of its surface opening in conjunction with the evaporation angles for producing the gate cavity. This allows the length to be controlled by a single hard-copy photomask and permits accurate control of gate length by means of calibrated, adjustable evaporation angles. Further, since the T-shaped lines are supported and protected by metal gate walls during the fabrication process, the yield is very high for this process even for gate lengths as short as 0.2 μm. Thus, the method of the invention permits the reliable manufacture of very low resistance T-shaped lines and provides a capability of fabricating sub-quarter-micron lines using only conventional optical lithography. The lines produced by this method are compatible with deeply-recessed gate structures to minimize parasitic resistances.

BRIEF DESCRIPTION OF THE DRAWINGS

The foregoing and additional objects, features and advantages of the present invention will be evident to those of skill in the art from a consideration of the following more detailed description of the invention, taken in conjunction with the accompanying drawings, in which.

DESCRIPTION OF PREFERRED EMBODIMENTS

Figure 1:
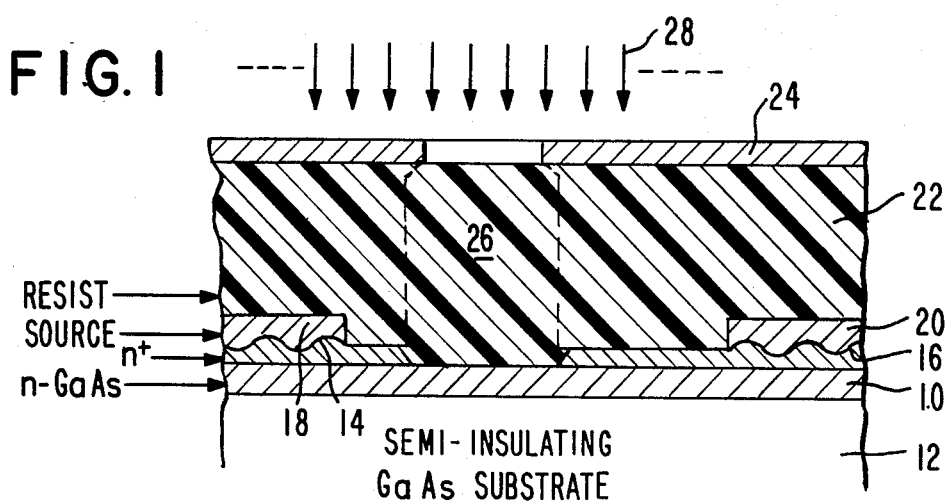
FIG. 1 is a diagrammatic cross-sectional illustration of the formation of a resist profile for a gate electrode on a MESFET device.

Turning now to a more detailed consideration of the present invention, there is illustrated in FIG. 1 a cross-sectional view of a semiconductor wafer 10 on a GaAs semi insulating substrate 12, wherein the wafer is a material such as n-type gallium arsenide (GaAs) which is prepared for reception of a gate electrode. The wafer may be prepared in conventional manner, which may include procedures such as, for example, the epitaxial growth of layers such as ohmic contacts 14 and 16 and the formation of source and drain electrodes 18 and 20, respectively, which cooperate with the ohmic contacts to define source and drain regions in the semiconductor. The provision of source and drain electrodes prior to the formation of the gate electrode, although optional, is preferred.

After preparation of the wafer 10, a layer 22 of conventional photoresist material is deposited on the upper surface of the wafer, and on any layers and contacts formed on the wafer. By standard photolithographic techniques utilizing a conventional mask 24, a gate pattern 26 in the photoresist material is selectively exposed as by ultra-violet light 28, and then removed, as by soaking the wafer in a suitable solvent such as chlorobenzine. The result of this optical lithography is the formation of a resist profile 30, illustrated in FIG. 2.

Although the resist material preferably is a photoresist material, it will be apparent that other resist materials such as an electron-beam resist, can be used, and that other lithographic techniques, such as electron-beam lithography can be used in accordance with the present invention.

Figure 2:
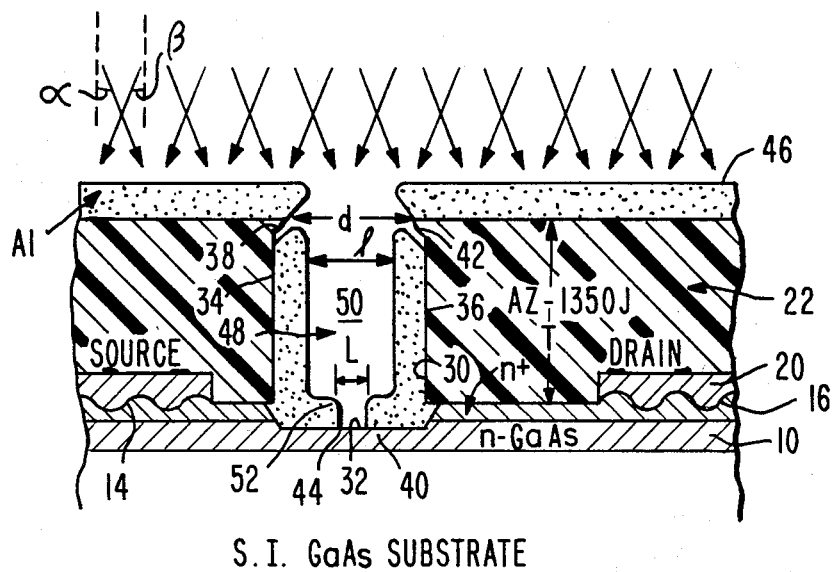
FIG. 2 is a diagrammatic cross-sectional illustration of the formation of a T-shaped gate cavity by dual-angle evaporation.

The resist profile 30 is preferably an elongated cavity formed in the resist material 22 to expose a linear portion of the upper surface 32 of the n-type GaAs wafer 10 in the area between the source and drain regions, to permit fabrication of the gate electrode and the consequent formation of a Schottky interface at surface 32. The distance across the cavity, as viewed in FIG. 2, is greater than the desired length of the gate electrode to accommodate metal gate walls, to be described. It should be understood that the distance across the cavity is, in accordance with standard terminology, the length of the cavity, since the length of a gate electrode is measured in the direction of an imaginary line running from the source electrode to the drain electrode. The gate width, therefore, is measured along the surface 32 in a direction perpendicular to the source-to-drain line.

After removal of the resist material from the gate pattern 26, the exposed surface 32 may be etched in conventional manner to prepare the surface to receive the metal layer to be deposited; thereafter, metal gate walls 34 and 36 are deposited by dual angle evaporation. These walls preferably are formed of aluminum, the deposition taking place by directing the evaporant at a first angle $\alpha$ from the vertical to form wall 36 and at a second angle $\beta$ from the vertical to form wall 34. The location and extent of the walls is dependent upon the thickness T of the resist material, the distance d across the surface opening of the resist profile 30 and the angles $\alpha$ and $\beta$ at which the evaporant is directed. As illustrated, the evaporant directed at angle $\alpha$ which passes the left-hand (as viewed in FIG. 2) edge 38 of the resist cavity strikes a point 40 on the right-hand portion of surface 32, so that the $\alpha$-directed evaporant deposits Al from the point 40 across the surface 32 toward the right-hand wall of the resist cavity 30, and up the right-hand wall, to form gate wall 36. Similarly, the evaporant directed at angle $\beta$ which passes the right-hand edge 42 of the resist cavity strikes a point 44 on the left-hand portion of surface 32, so that $\beta$-directed evaporant deposits Al from point 44 across the surface 32 toward the left-hand wall of the resist cavity 30, and up the left-hand wall, to form gate wall 34.

The Al is deposited on the interior surfaces of the resist profile to a desired thickness, as determined by the desired maximum length l of the upper portion of the T-shaped gate. The Al is also deposited on the upper surface of the remaining resist material 22, to form a layer 46, but this is incidental to the formation of the gate walls.

The angle at which the Al evaporation is directed, the width d of the resist cavity, and the thickness T of the resist 22 cooperate to deposit walls 34 and 36 in such a way as to form a gate cavity 48 having a large upper portion 50 and a narrow lower portion 52. The lower portion, which extends between points 40 and 44, has a length L and defines the lower portion of the T-shaped gate electrode at its interface with surface 32, while the upper portion 50 defines the limits of the upper part of the gate electrode. By precise adjustment of the directions $\alpha$ and $\beta$ of the dual-angle evaporation, and by careful monitoring of the deposited Al, the length L of the portion 52 can be fabricated as short as about 0.2 $\mu$m at the interface with surface 32.

The evaporation of the Al gate walls is accomplished by conventional evaporation techniques, with the evaporant being directed at the angles $\alpha$ and $\beta$ in accordance with known methods of deposition.

Figure 3:
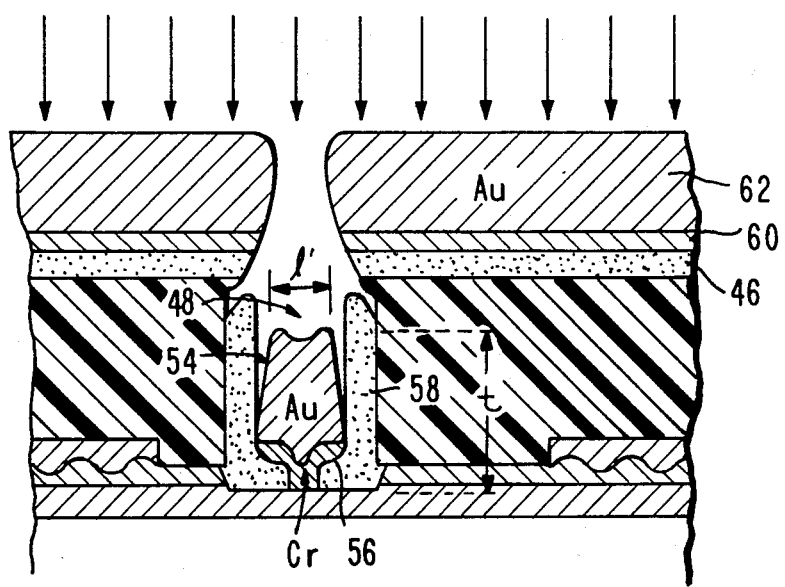
FIG. 3 is a diagrammatic cross-sectional illustration of a T-shaped gate formed within the gate cavity by direct evaporation.

Upon completion of the gate cavity 48, a selected gate metal or selected gate metals are evaporated into the T-shaped gate cavity 48 to form a gate electrode 54. As illustrated in FIG. 3, gate metals, for example chromium (Cr) and gold (Au), are sequentially deposited by direct vertical evaporation to form a bottom Cr layer 56 in contact with surface 32 and a top Au layer 58 overlying the layer 56. The bottom layer 56 forms the base of gate electrode 54, and, as is known in the art, is formed as a very thin layer which serves to metalize the surface 32 of wafer 10 to prepare it for receiving the top electrode layer 58.

The bottom layer 56 fills the narrow lower portion 52 of the gate cavity 48, as illustrated, while the top layer 58 substantially fills the upper portion 50 of cavity 48. It will be noted that as the electrode metals are deposited in the gate cavity 48, excess metal is also deposited on the layer 46 which was previously formed on the upper surface of the resist 22, the excess Cr forming layer 60 and the excess Au forming layer 62. As illustrated in FIG. 3, the evaporation of Al, Cr and Au onto the upper surface of the resist 22 causes a gradual buildup which extends over the resist and gate cavities and narrows the opening through which the metals are deposited in those cavities. As a result, the gate electrode is tapered slightly inwardly from bottom to top, and the deposited gate material does not completely fill the gate cavity.

Figure 4:
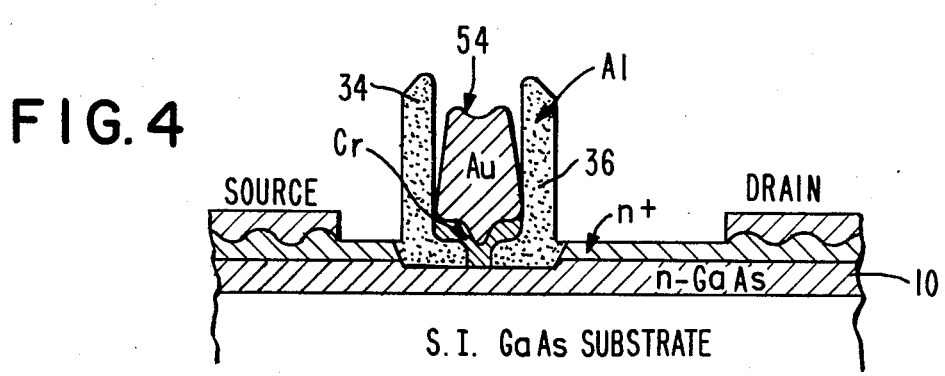
FIG. 4 is a diagrammatic cross-sectional illustration of a T-shaped gate electrode guarded by two gate walls, formed by the removal of resist material from the MESFET device.

After the gold layer 58 has been deposited, the excess metal layers 46, 60 and 62, and the resist layer 22 are removed by a suitable solvent, such as acetone, to produce the T-shaped gate electrode 54 guarded by walls 34 and 36, as shown in FIG. 4. The walls mechanically protect the electrode during the mechanical handling that is required to effect removal of the resist and excess metal layers, and thus substantially improve the effectiveness of this fabrication process.

Figure 5:
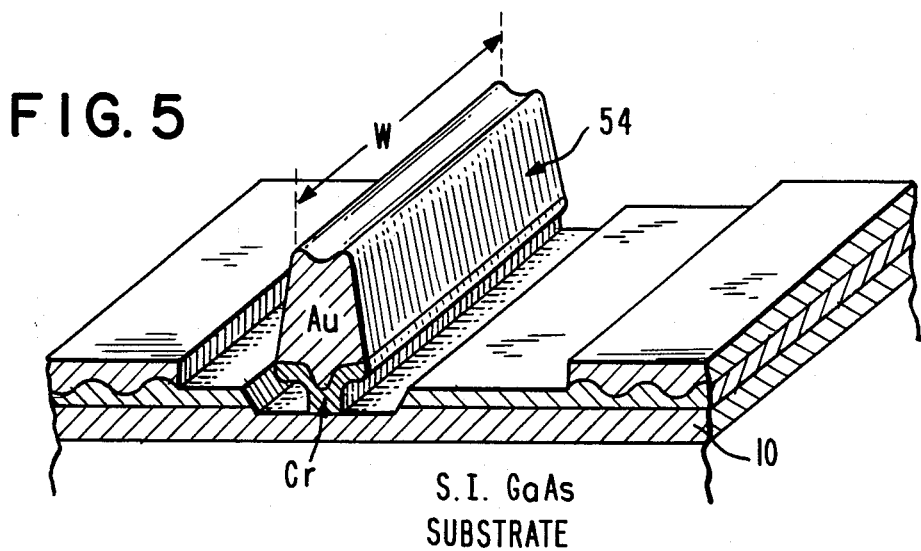
FIG. 5 is a diagrammatic perspective view in partial section of a completed T-shaped MESFET gate electrode.

The wafer with the gate electrode in place is finally dipped into an etchant such as a hot phosphoric acid solution to etch off the Al gate walls 34 and 36, leaving the gate electrode 54 mounted on the wafer 10 in the manner illustrated in FIG. 5.

The single-level resist and two step evaporation process of the present invention thus provides a simple, high-yield, reliable method of fabricating T-shaped gate electrodes for semiconductor devices. The system utilizes a simple optical lithographic process which in experiments has given a 90% yield of very low resistance sub-half-micron T-shaped (or mushroom-shaped) gate electrodes, the process being compatible with deep-recess gate structures to minimize source resistance.

Through the use of the present invention, gate electrodes with a length as short as about 0.2 $\mu$m near the Schottky interface have been fabricated. As illustrated in FIG. 3, the top portion of the gate electrode tapers from a length l, determined by the size of the gate cavity 48, to a length of l', which may be about 0.8 $\mu$m. Gates produced by this process had a thickness t (FIG. 3) of about 1.6 $\mu$m and a width W (FIG. 5) of about 150 $\mu$m. The measured gate resistance of devices fabricated in accordance with the invention was 6.1 $\Omega$/mm of gate width. The electrical properties of the MESFET device of FIG 5 were measured, and showed that at a frequency of 18 GHz the maximum available gain was 9 dB. A dual gate device constructed in accordance with the invention produced a maximum stable gain of 19.5 dB. However, these values were not optimized, since the GaAs material used in the experiment had a serious back-gating effect. Furthermore, it has been found that measured gate resistances can be further reduced by center feeding the T-shaped gate electrode. Thus, it is apparent that a highly useful low-noise microwave MESFET is produced by the disclosed method.

Although the invention has been described in terms of a preferred embodiment, it will be apparent that variations and modifications can be made without departing from the true spirit and scope thereof, as set forth in the following claims.

What is claimed is:

1. A method of fabricating a low-resistance T-shaped gate electrode for a semiconductor device, comprising:
   depositing a layer of resist material on a semiconductor surface;
   defining a gate pattern in said resist material to produce a resist profile;
   forming metal gate walls within and on the surface of said resist profile by angled evaporation to produce a metallized T-shaped gate cavity, said gate cavity having a bottom opening adjacent to and exposing said semiconductor surface, the dimension of said bottom opening being determined by the thickness of said layer of resist material and the angle of evaporation of said metal;
   directly evaporating a gate material into said gate cavity, said gate material being deposited on the portion of said semiconductor surface exposed by the bottom opening of said gate cavity to form a Schottky junction at said semiconductor surface and being further deposited within said gate cavity to substantially fill said T-shaped gate cavity;
   removing said layer of resist material; and
   removing said gate walls.

2. The method of claim 1, wherein said gate material is deposited in a single layer.

3. The method of claim 1, wherein said gate material is deposited in two sequential layers.

4. The method of claim 1, wherein said gate material is a metal that will not be damaged by the removal of said gate walls.

5. The method of claim 4, wherein said gate walls are formed of aluminum.

6. The method of claim 5, wherein said gate material comprises chromium and gold.

7. The method of claim 1 wherein said metal gate walls are formed by evaporative deposition of aluminum.

8. The method of claim 1, wherein said gate walls are formed by dual-angle evaporation of metal.

9. The method of claim 1, wherein said gate walls are formed by dual-angle evaporation of a metal which can be removed from said gate material without damage to the gate.

10. The method of claim 1, wherein said gate walls are formed by the evaporative deposition of aluminum.

11. The method of claim 1, wherein said resist mateial is a photoresist material, and wherein said gate pattern is defined by photolithography.

12. The method of claim 1, wherein said resist material is in electron beam resist material, and wherein said gate pattern is defined by electron beam lithography.

13. The method of claim 1, wherein said gate pattern is defined by optical lithography.

14. The method of claim 1, further including the step of etching said exposed semiconductor surface after producing said resist profile.

15. The method of claim 1, wherein the evaporation of metal onto the surfaces of said resist profile 3 includes evaporative deposition of said metal at an angle with respect to said semiconductor surface, said angle being such that the top edge of said resist profile blocks the deposition of said metal on that portion of said semiconductor which is to remain exposed through said bottom opening in said gate cavity.

16. The method of claim 15, wherein said gate walls are formed by dual angle evaporation, whereby metal gate walls are formed on opposed surfaces of said resist profile substantially simultaneously.

17. The method of claim 16, wherein said metal gate walls are formed by evaporative deposition of aluminum.

18. The method of claim 17, wherein the step of removing said layer of resist material includes the removal of excess gate wall metal and gate material incidentally deposited on the surface of said resist material.

19. A method of fabricating a low resistance, T-shaped gate electrode for a MESFET device, comprising:

depositing a single layer of resist material on a semiconductor surface;

forming a resist cavity within said layer of resist material to expose a selected portion of said semiconductor surface;

depositing gate walls within said resist cavity by way of dual-angle evaporation, the angles of evaporation producing gate walls which define a T-shaped gate cavity having a short bottom opening at said semiconductor surface;

depositing gate electrode material into said gate cavity to form a T-shaped electrode having a Schottky junction at said semiconductor surface;

removing said resist material from said semiconductor surface; and removing said gate walls from said gate electrode.

* * * * *